United States Patent
Koyama

(10) Patent No.: US 8,569,853 B2
(45) Date of Patent: Oct. 29, 2013

(54) SEMICONDUCTOR LIGHT-RECEIVING DEVICE

(75) Inventor: Yuji Koyama, Kanagawa (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 13/558,725

(22) Filed: Jul. 26, 2012

(65) Prior Publication Data

US 2013/0026595 A1    Jan. 31, 2013

(30) Foreign Application Priority Data

Jul. 29, 2011    (JP) .................. 2011-167228

(51) Int. Cl.
*H01L 27/14* (2006.01)
*H01L 31/00* (2006.01)

(52) U.S. Cl.
USPC .... 257/431; 257/448; 257/466; 257/E27.122; 257/E31.038; 257/E31.113

(58) Field of Classification Search
USPC .......... 257/431, 448, 466, E27.122, E31.038, 257/E31.113
See application file for complete search history.

(56) References Cited

U.S. PATENT DOCUMENTS

2011/0011454 A1*    1/2011    Taira .............................. 136/256

FOREIGN PATENT DOCUMENTS

JP            04-290477 A        10/1992

* cited by examiner

*Primary Examiner* — David S Blum
(74) *Attorney, Agent, or Firm* — Westerman, Hattori, Daniels & Adrian, LLP

(57) ABSTRACT

A semiconductor light-receiving device includes a semiconductor light-receiving element that has a first electrode and a second electrode, a first wiring coupled to the first electrode, and a second wiring coupled to the second electrode, a width of the second wiring being smaller than a width of the first wiring.

19 Claims, 9 Drawing Sheets

FIRST COMPARATIVE EXAMPLE

SECOND COMPARATIVE EXAMPLE

FIG. 3A  FIRST EMBODIMENT
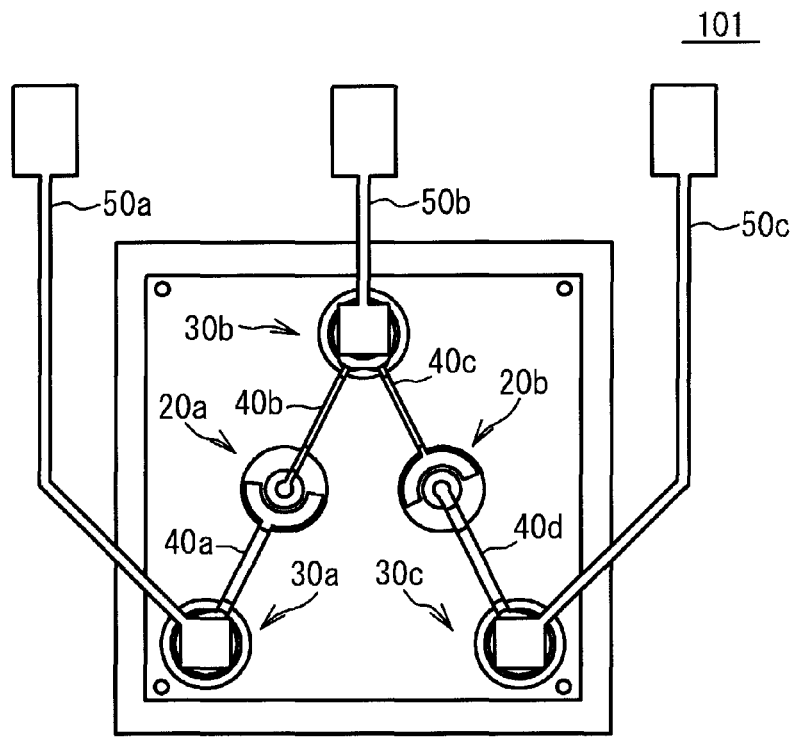
FIG. 3B
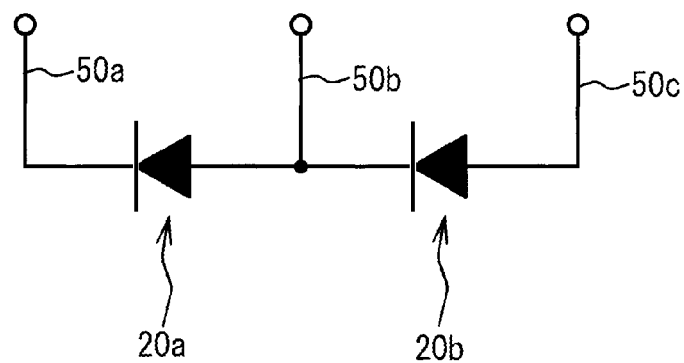

SECOND EMBODIMENT

FIG. 7A      SECOND EMBODIMENT
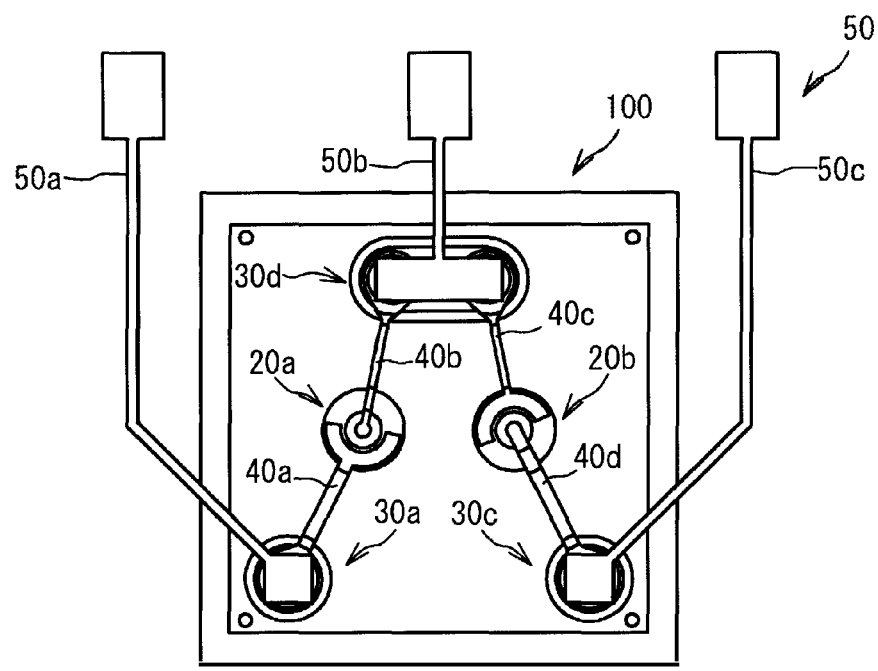
FIG. 7B
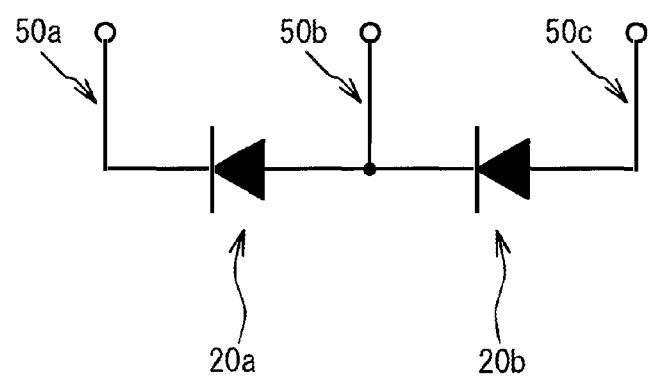

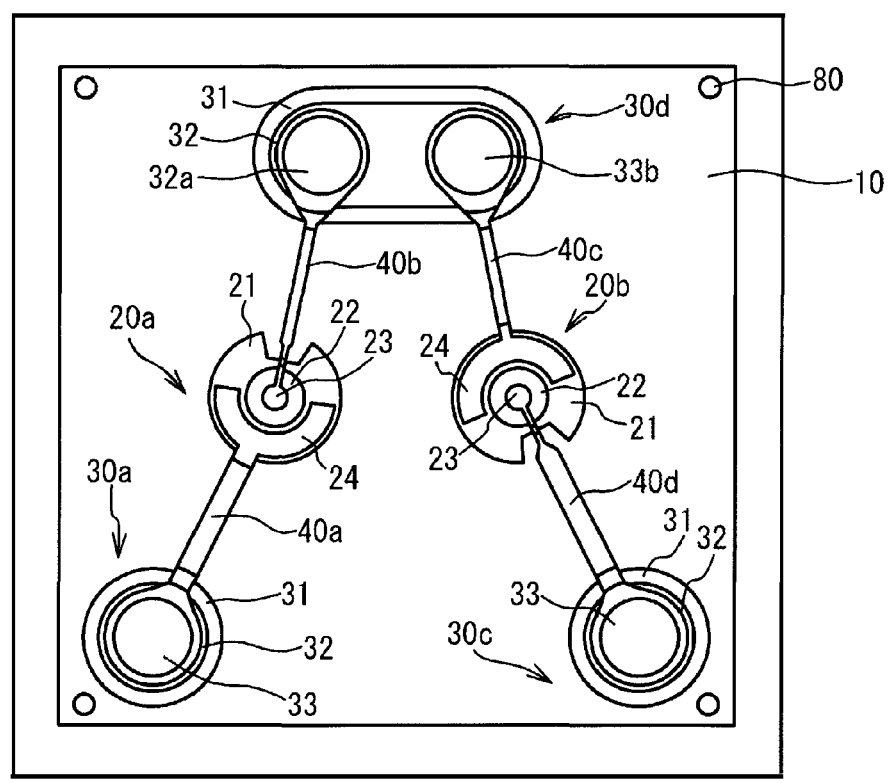
FIG. 8 THIRD EMBODIMENT

FIG. 9A   THIRD EMBODIMENT
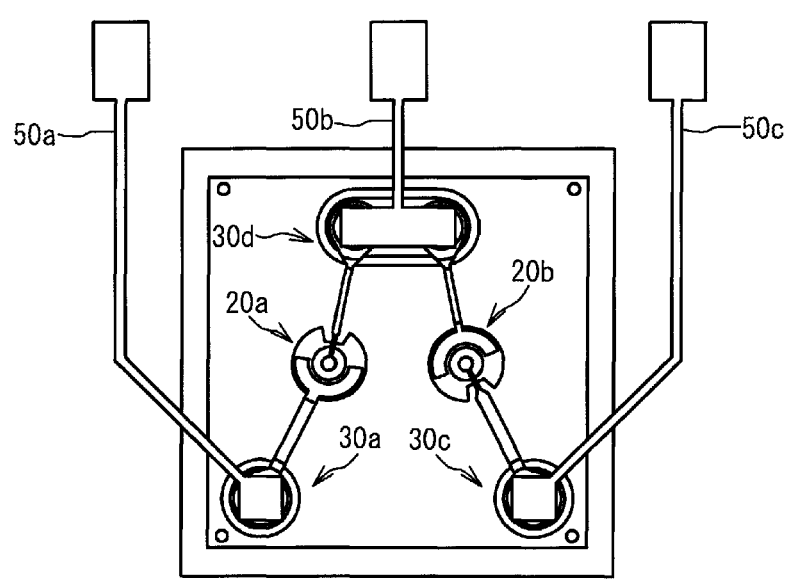
FIG. 9B
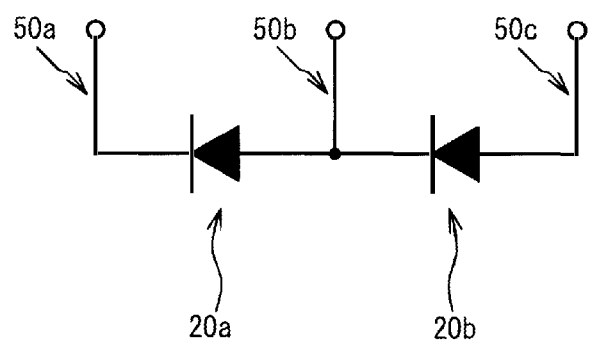

SEMICONDUCTOR LIGHT-RECEIVING DEVICE

CROSS-REFERENCE TO RELATED APPLICATION

This application is based upon and claims the benefit of priority of the prior Japanese Patent Application No. 2011-167228, filed on Jul. 29, 2011, the entire contents of which are incorporated herein by reference.

BACKGROUND (i) Technical Field

The present invention relates to a semiconductor light-receiving device.

(ii) Related Art

A semiconductor light-receiving device having a flip-chip type mesa semiconductor light-receiving element on a semiconductor substrate is being developed. For example, Japanese Patent Application Publication No. 04-290477 (hereinafter referred to as Document 1) a semiconductor light-receiving element in which a mesa light-receiving portion is provided on the semiconductor substrate, an electrode pad electrically coupled to an electrode on the light-receiving portion is provided on a dummy mesa that is different from the mesa light-receiving portion.

SUMMARY

It is an object to determine an inductance and a capacitance without being constrained by only a length of a wiring and thereby improve characteristics of a semiconductor light-receiving device According to an aspect of the present invention, there is provided a semiconductor light-receiving device including a semiconductor light-receiving element that has a first electrode and a second electrode, a first wiring coupled to the first electrode, and a second wiring coupled to the second electrode, a width of the second wiring being smaller than a width of the first wiring.

According to another aspect of the present invention, there is provided a semiconductor light-receiving device including a semiconductor light-receiving element that has a first electrode and a second electrode, a first wiring coupled to the first wiring, and a second wiring coupled to the second electrode, a parasitic capacitance of the first wiring being smaller than a parasitic capacitance of the second wiring.

According to another aspect of the present invention, there is provided a semiconductor light-receiving device including a first semiconductor light-receiving element that has a first electrode and a second electrode, a second semiconductor light-receiving element that has a third electrode and a fourth electrode, a first wiring of which first end is coupled to the first electrode, a second wiring of which first end is coupled to the second electrode, a third wiring of which first end is coupled to the third electrode, and a fourth wiring of which first end is coupled to the fourth electrode, widths of the second wiring and the third wiring being smaller than widths of the first wiring and the fourth wiring.

BRIEF DESCRIPTION OF THE DRAWINGS

FIG. 3A illustrates a module in which a semiconductor light-receiving device is coupled to a carrier;

FIG. 3B illustrates a circuit diagram of the module;

FIG. 7A illustrates a module in which a semiconductor light-receiving device is coupled to a carrier;

FIG. 7B illustrate a circuit diagram of the module;

FIG. 8 illustrates a top view of a semiconductor light-receiving device in accordance with a third embodiment;

FIG. 9A illustrates a module in which a semiconductor light-receiving device is coupled to a carrier; and FIG. 9B illustrates a circuit diagram of the module.

DETAILED DESCRIPTION

In the semiconductor light-receiving device disclosed in Document 1, a width of a wiring coupled to a p-side electrode of a light-receiving element is the same as that of another wiring coupled to a n-side electrode of the light-receiving element. Therefore, an inductance and a capacitance of the wirings are substantially determined by a length of the wirings.

A description will be given of comparative examples with reference to FIG. 1A and FIG. 1B.

Comparative Examples

Figure 1A:
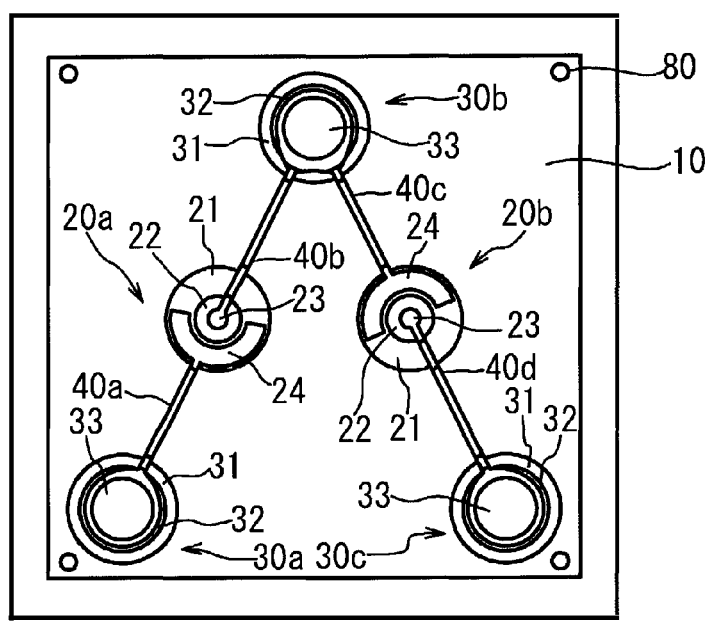
FIG. 1A illustrates a top view of a semiconductor light-receiving device in accordance with a first comparative example.
Figure 1B:
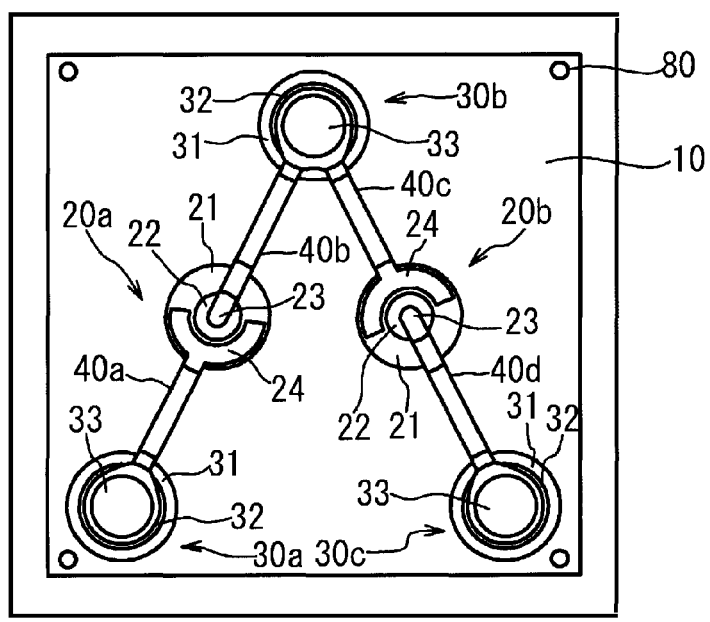
FIG. 1B illustrates a top view of a semiconductor light-receiving device in accordance with a second comparative example.

FIG. 1A illustrates a top view of a semiconductor light-receiving device 201 in accordance with a first comparative example. FIG. 1B illustrates a top view of a semiconductor light-receiving device 202 in accordance with a second comparative example. As illustrated in FIG. 1A and FIG. 1B, the semiconductor light-receiving devices 201 and 202 have a structure in which light-receiving elements 20a and 20b and dummy mesas 30a through 30c are provided on a semiconductor substrate 10. The light-receiving elements 20a and 20b and the dummy mesas 30a through 30c independently have a mesa shape. The semiconductor light-receiving devices 201 and 202 have a chip area and a scribed area around the chip area. An alignment mark 80 is formed on a corner of the chip area.

The light-receiving elements 20a and 20b have a structure in which an upper mesa 22 and an upper electrode 23 are provided on a lower mesa 21 in this order. For example, the lower mesa 21 has a circular cylinder shape. The upper mesa 22 has a circular cylinder shape having a diameter smaller than the lower mesa 21, and is arranged on a center of the lower mesa 21. The upper mesa 22 acts as a light-receiving region. The upper electrode 23 has a circular cylinder shape having a diameter smaller than the upper mesa 22, and is arranged on a center of the upper mesa 22. That is, the light-receiving elements 20a and 20b have a mesa shape whose diameter is larger at lower portion and is smaller at upper portion. Further, the light-receiving elements 20a and 20b have a lower electrode 24 on the lower mesa 21 except for the upper mesa 22. In the first and second comparative examples, the upper electrode 23 acts as a p-side electrode, and the lower electrode 24 acts as an n-side electrode.

The dummy mesas 30a through 30c have a structure in which an upper mesa 32 and an upper electrode 33 are provided on a lower mesa 31 in this order. For example, the lower mesa 31 has a circular cylinder shape. The upper mesa 32 has a circular cylinder shape having a diameter smaller than the lower mesa 31, and is arranged on a center of the lower mesa 31. The upper electrode 33 has a circular cylinder shape having a diameter smaller than the upper mesa 32 and is arranged on a center of the upper mesa 32. That is, the dummy mesas 30a through 30c have a mesa shape whose diameter is larger at lower portion and is smaller at upper portion. The dummy mesas 30a through 30c fail to have a function as a light-receiving element.

The upper electrode 33 of the dummy mesa 30a is coupled to the lower electrode 24 of the light-receiving element 20a by a wiring 40a going through a surface of the dummy mesa 30a, an upper face of the semiconductor substrate 10, and a surface of the light-receiving element 20a. The upper electrode 23 of the light-receiving element 20a is coupled to the upper electrode 33 of the dummy mesa 30b by a wiring 40b going through the surface of the light-receiving element 20a, the upper face of the semiconductor substrate 10, and a surface of the dummy mesa 30b.

The upper electrode 33 of the dummy mesa 30b is coupled to the lower electrode 24 of the light-receiving element 20b by a wiring 40c going through the surface of the dummy mesa 30b, the upper face of the semiconductor substrate 10, and a surface of the light-receiving element 20b. The upper electrode 23 of the light-receiving element 20b is coupled to the upper electrode 33 of the dummy mesa 30c by a wiring 40d going through the surface of the light-receiving element 20b, the upper face of the semiconductor substrate 10, and a surface of the dummy mesa 30c.

The surface of the light-receiving elements 20a and 20b, the surface of the dummy mesas 30a through 30c, and the upper face of the semiconductor substrate 10 are covered by an insulating layer such as silicon nitride (SiN). The wirings 40a through 40d are provided on the insulating layer. Thus, each wiring is insulated from the light-receiving elements 20a and 20b, the dummy mesas 30a through 30c and the semiconductor substrate 10.

In the semiconductor light-receiving devices 201 and 202, the wirings 40a through 40d have an inductance and a capacitance. There are methods of increasing the thickness of the insulating layer and using an insulating layer having a large relative permittivity in order to reduce the capacitance. However, with the methods, it is necessary to change a processing condition, and characteristics may be degraded.

When the width of the wirings 40a through 40d is reduced as illustrated in FIG. 1A, the capacitance of the wirings 40a through 40d is reduced. However, the inductance of the wirings 40a through 40d is enlarged. On the other hand, when the width of the wirings 40a through 40d is enlarged as illustrated in FIG. 1B, the inductance of the wirings 40a through 40d is reduced. However, the capacitance of the wirings 40a through 40d is enlarged. Therefore, the capacitance and the inductance have a trade-off relation in the semiconductor light-receiving device. The width of the wirings 40a through 40d is defined as a width of the longest region of a region of which side faces are in parallel with each other in a length direction of the wirings 40a through 40d.

First Embodiment

Figure 2:
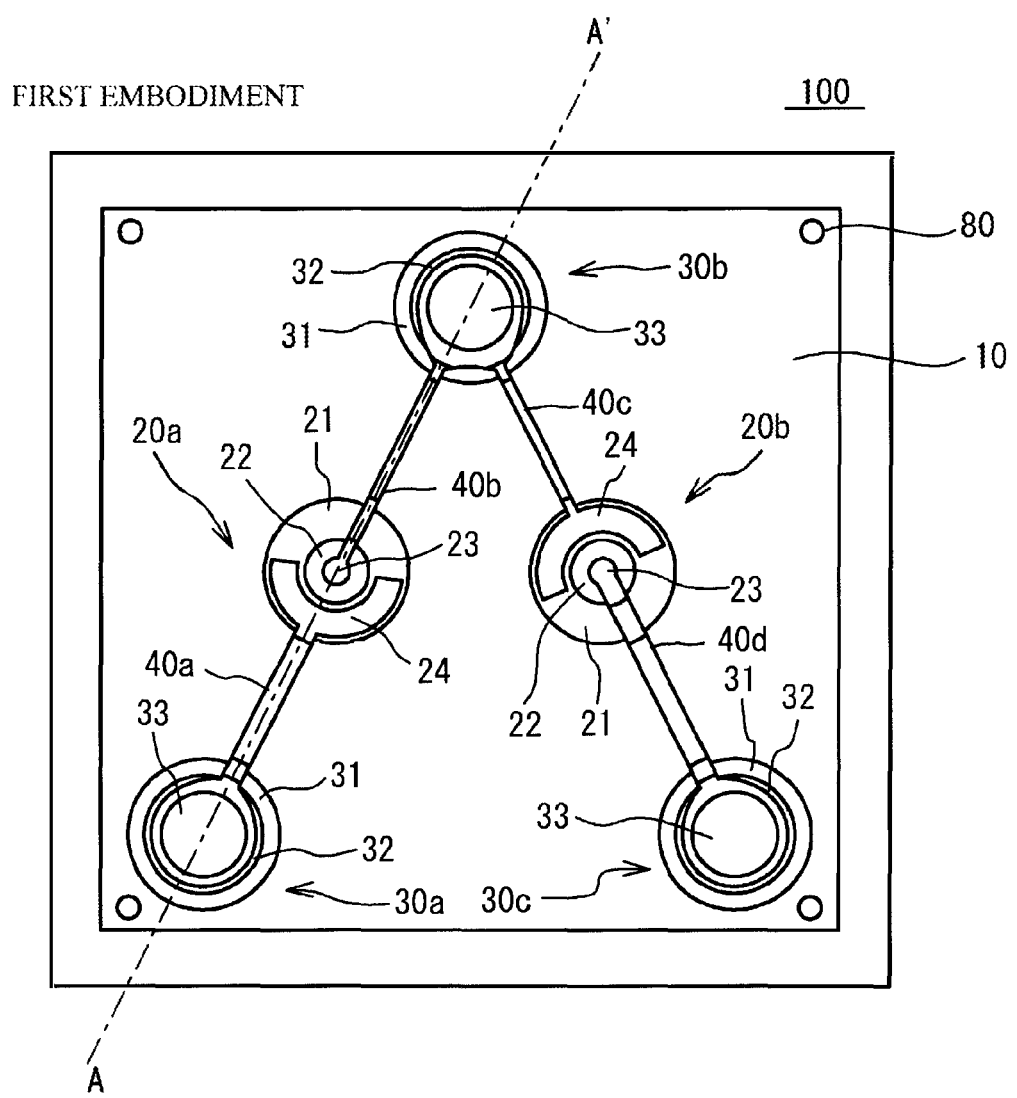
FIG. 2 illustrates a top view of a semiconductor light-receiving device in accordance with a first embodiment.

FIG. 2 illustrates a top view of a semiconductor light-receiving device 100 in accordance with a first embodiment.

FIG. 3A illustrates a module 101 in which the semiconductor light-receiving device 100 is coupled to a carrier 50. The carrier 50 acts as a mount substrate on which the semiconductor light-receiving device 100 is mounted. FIG. 3B illustrates a circuit diagram of the module 101. As illustrated in FIG. 2, FIG. 3A and FIG. 3B, a width relation of the wirings 40a through 40d is different from that of the semiconductor light-receiving devices 201 and 202. In the first embodiment, on the semiconductor substrate 10, the width of a parallel region of the wirings 40a and 40d is larger than that of a parallel region of the wirings 40b and 40c. The wirings 40a through 40d are longer than the diameter of an upper face of a mesa (the diameter of the upper mesa 22). As an example, the diameter of the lower mesa 21 of the light-receiving elements 20a and 20b is 100 µm, and the diameter of the upper mesa 22 is 50 µm. The length of the parallel region of the wirings 40a and 40c is 120 µm. The length of the parallel region of the wirings 40b and 40d is 170 µm. On the semiconductor substrate 10, the width of the wirings 40a and 40d is 20 µm, and the width of the wirings 40b and 40c is 10 µm. It is preferable that the parallel region of the wirings 40a through 40d has a length of 50 µm to 200 µm.

Next, as illustrated in FIG. 3A, a carrier wiring 50a is coupled to the upper electrode 33 of the dummy mesa 30a. A carrier wiring 50b is coupled to the upper electrode 33 of the dummy mesa 30b. A carrier wiring 50c is coupled to the upper electrode 33 of the dummy mesa 30c.

As illustrated in FIG. 3B, in the module 101, the light-receiving elements 20a and 20b act as a balanced type light-receiving element in which the light-receiving elements 20a and 20b are coupled in series in an identical direction. In the first embodiment, a p-side electrode of the light-receiving element 20a is coupled to an n-side electrode of the light-receiving element 20b. The carrier wiring 50a acts as an n-type terminal coupled to the n-side electrode of the light-receiving element 20a. The carrier wiring 50b acts as a common terminal coupled between the light-receiving element 20a and the light-receiving element 20b. The carrier wiring 50c acts as a p-side terminal coupled to the p-side electrode of the light-receiving element 20b. An output signal is extracted from the common terminal. With respect to high frequency wave, the n-type terminal and the p-type terminal act as a ground terminal. In the example of FIG. 3B, a reverse bias is applied to the p-type terminal and the n-type terminal. Thus, the balanced type module 101 enlarges signal amplitude and outputs the signal.

Figure 4:
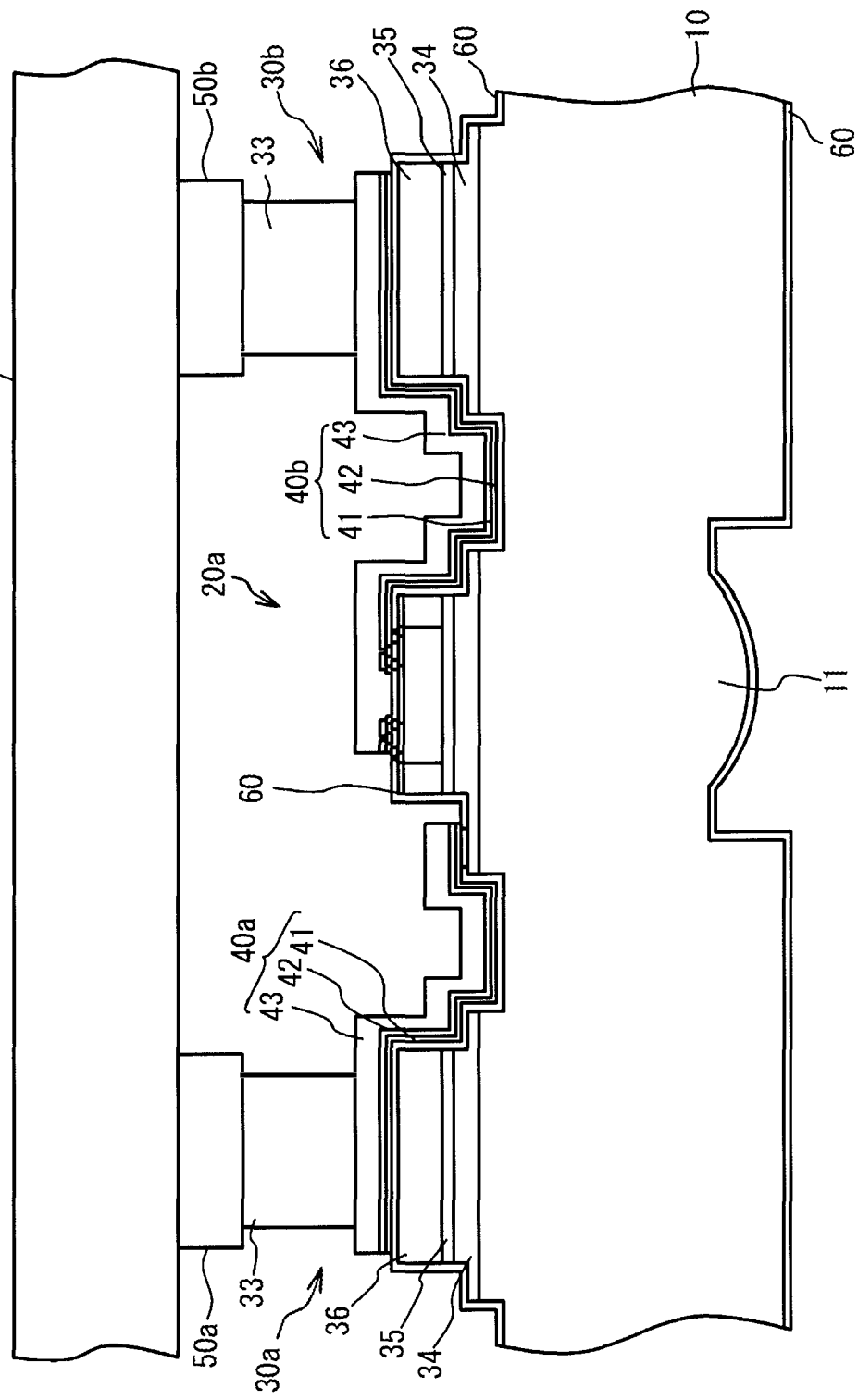
FIG. 4 illustrates a cross sectional view taken along a line A-A' of FIG. 2.
Figure 5:
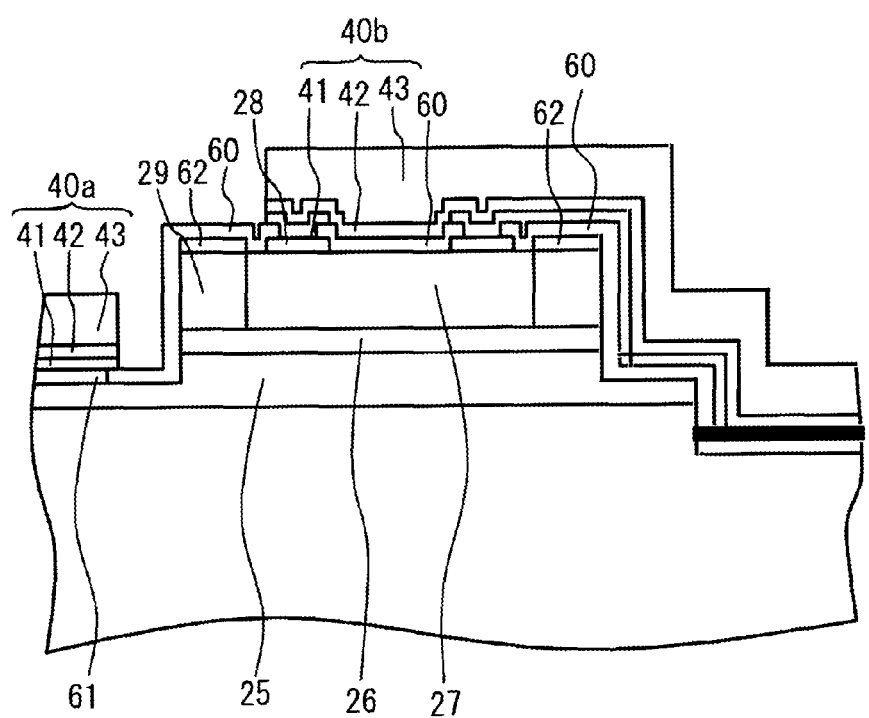
FIG. 5 illustrates an enlarged view of a light-receiving element.

FIG. 4 illustrates a cross sectional view taken along a line A-A' of FIG. 2. In FIG. 4, a cross section of the carrier 50 is also illustrated. FIG. 5 illustrates an enlarged cross sectional view of the light-receiving element 20a. As illustrated in FIG. 4 and FIG. 5, the light-receiving element 20a has a structure in which an n-type semiconductor layer 25, an i-type semiconductor layer 26, a p-type semiconductor layer 27 and a contact layer 28 are provided on the semiconductor substrate 10 in this order. The n-type semiconductor layer 25 is, for example, composed of n-type InP. The i-type semiconductor layer 26 is, for example, composed of i-type InGaAs. The p-type semiconductor layer 27 is, for example, composed of p-type InP. The thickness of the n-type semiconductor layer 25 is, for example, 1.0 µm. The thickness of the i-type semiconductor layer 26 is, for example, 1.0 µm. The thickness of the p-type semiconductor layer 27 is, for example, 1.0 µm.

The p-type semiconductor layer 27 has a diameter smaller than the i-type semiconductor layer 26. An n-type semiconductor layer 29 is provided on the side face of the p-type semiconductor layer 27 on the i-type semiconductor layer 26. The n-type semiconductor layer 29 is, for example, composed of n-type InP. The semiconductor substrate 10 is composed of a semi-insulated semiconductor and has resistivity of $2.2 \times 10^7$ $\Omega$cm to $6.6 \times 10^7$ $\Omega$cm. The semiconductor substrate 10 is, for example, composed of semi-insulated InP. The contact layer 28 is, for example, composed of p-type InGaAs. The lower mesa 21 of FIG. 2 includes the n-type semiconductor layer 25. The upper mesa 22 of FIG. 2 includes a part of the n-type semiconductor layer 25, the i-type semiconductor layer 26, the p-type semiconductor layer 27, the contact layer 28 and the n-type semiconductor layer 29. The light-receiving element 20b has the same structure as the light-receiving element 20a. A lens 11 is formed on the reverse face of the semiconductor substrate 10 facing with the light-receiving elements 20a and 20b. Thus, an incoming light to the reverse face of the semiconductor substrate 10 is focused into the light-receiving elements 20a and 20b.

The dummy mesas 30a and 30b have a structure in which an n-type semiconductor layer 34, an i-type semiconductor layer 35 and an n-type semiconductor layer 36 are provided on the semiconductor substrate 10 in this order. The n-type semiconductor layer 34 is, for example, composed of n-type InP. The i-type semiconductor layer 35 is, for example, composed of i-type InGaAs. The n-type semiconductor layer 36 is, for example, composed of n-type InP. The lower mesa 31 of FIG. 2 includes the n-type semiconductor layer 34. The upper mesa 32 of FIG. 2 includes a part of the n-type semiconductor layer 34, the i-type semiconductor layer 35 and the n-type semiconductor layer 36. The dummy mesa 30c has the same structure as the dummy mesa 30a.

An insulating layer 60 is composed of a nitride such as SiN and covers the surface of the light-receiving elements 20a and 20b, the surface of the dummy mesas 30a through 30c, and the surface of the semiconductor substrate 10. A diffusion mask 62 is provided between the upper face of the n-type semiconductor layer 29 and the insulating layer 60. The diffusion mask 62 is composed of a nitride such as SiN and has a thickness of approximately 0.2 μm. The wirings 40a and 40b have a structure in which a Ti/Pt layer 41, an Au sputtering layer 42, and an Au coating layer 43 are laminated in this order from the semiconductor substrate 10 side, and is provided on the insulating layer 60. Thus, the wirings 40a and 40b are insulated from the light-receiving element 20a, the dummy mesas 30a and 30b and the semiconductor substrate 10. The thickness of the insulating layer 60 is, for example, 0.2 μm. The thickness of the wirings 40a and 40b is, for example, 2.0 μm. The wirings 40c and 40d have the same structure as the wirings 40a and 40b.

The insulating layer 60 has an opening on the contact layer 28. Thus, the contact layer 28 of the light-receiving element 20a is contact to the wiring 40b. Similarly, the contact layer 28 of the light-receiving element 20b is contact to the wiring 40d. The insulating layer 60 has an opening on the lower mesa 21 except for the upper mesa 22. A contact layer 61 is formed in the opening of the lower mesa 21. Thus, the n-type semiconductor layer 25 of the light-receiving element 20a is contact to the wiring 40a through the contact layer 61. Similarly, the n-type semiconductor layer 25 of the light-receiving element 20b is contact to the wiring 40c through the contact layer 61. The contact layer 61 is, for example, composed of AuGe/Au. The insulating layer 60 covers the surface of the dummy mesas 30a through 30c and covers the semiconductor substrate 10 between the light-receiving elements and the dummy mesas.

The wiring 40a on the lower mesa 21 of the light-receiving element 20a acts as the lower electrode 24 of the light-receiving element 20a. The wiring 40b on the contact layer 28 of the light-receiving element 20a acts as the upper electrode 23 of the light-receiving element 20a. The wiring 40c on the lower mesa 21 of the light-receiving element 20b acts as the lower electrode 24 of the light-receiving element 20b. The wiring 40d on the contact layer 28 of the light-receiving element 20b acts as the upper electrode 23 of the light-receiving element 20b.

In the first embodiment, the capacitance is suppressed, because the width of the wirings 40b and 40c provided on the insulating layer 60 on the semiconductor substrate 10 is smaller than that of the wirings 40a and 40d. The wirings 40b and 40c are coupled to the upper electrode 33 of the dummy mesa 30b that is an output side of the semiconductor light-receiving device. The characteristics of the semiconductor light-receiving device are improved because the parasitic capacitance applied to the output side of the semiconductor light-receiving device is reduced. On the other hand, the width of the wirings 40a and 40d is larger than that of the wirings 40b and 40c. Therefore, the inductance of the wirings 40a and 40d is suppressed. As illustrated in FIG. 3B, the wirings 40a and 40d are coupled to the upper electrode 33 of the dummy mesas 30a and 30c. The upper electrode 33 is coupled to a reference potential. For example, one of the upper electrodes 33 is grounded, and the other is coupled to a high potential power supply. Alternatively, one of the upper electrodes 33 is coupled to a low potential power supply, and the other is coupled to the high potential power supply. That is, the wirings 40a and 40d are a wiring coupled to the reference potential. Therefore, reducing the inductance to the reference potential contributes to the improvement of the characteristics.

As mentioned above, with the structure of the semiconductor light-receiving device 100, the influence of the capacitance caused by the wiring is suppressed, and the inductance of the wiring is suppressed. The semiconductor light-receiving device 100 can be manufactured when the width of the wiring is changed in a conventional manufacturing method of a semiconductor light-receiving device. Therefore, the conventional manufacturing method can be used.

In the first embodiment, the light-receiving elements 20a and 20b acts as a semiconductor light-receiving element having a first electrode and a second electrode, a first semiconductor light-receiving element having a first electrode and a second electrode, or a second semiconductor light-receiving element having a third electrode and a fourth electrode. The upper electrode 23 of the light-receiving element 20a and the lower electrode 24 of the light-receiving element 20b act as an electrode to be coupled to an output side. The lower electrode 24 of the light-receiving element 20a and the upper electrode 23 of the light-receiving element 20b act as an electrode to be coupled to a reference potential side. The wiring 40a acts as the first wiring. The wiring 40b acts as the second wiring. The wiring 40c acts as the third wiring. The fourth wiring 40d acts as the fourth wiring.

Second Embodiment

Figure 6:
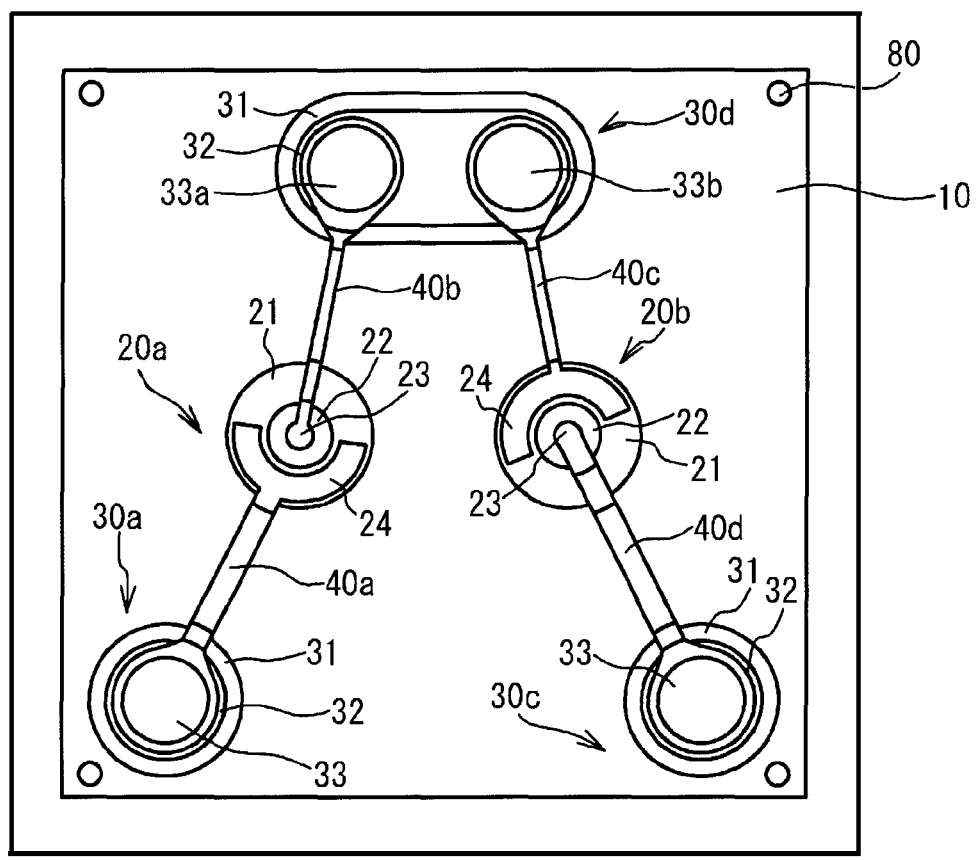
FIG. 6 illustrates a top view of a semiconductor light-receiving device in accordance with a second embodiment.

FIG. 6 illustrates a top view of a semiconductor light-receiving device 100a in accordance with a second embodiment. FIG. 7A illustrates a module 101a in which the semiconductor light-receiving device 100a is coupled to the carrier 50. FIG. 7B illustrates a circuit diagram of the module 101a. As illustrated in FIG. 6, FIG. 7A and FIG. 7B, in the semiconductor light-receiving device 100a, a dummy mesa 30d is provided instead of the dummy mesa 30b.

In the dummy mesa 30d, the upper mesa 32 is provided on the lower mesa 31, and an upper electrode 33a and an upper electrode 33b are provided on the upper mesa 32. The upper electrode 33a is coupled to the wiring 40b. The upper electrode 33b is coupled to the wiring 40c. The upper electrode 33a and the upper electrode 33b are provided on the insulating layer 60 and are spaced from each other. Therefore, the upper electrode 33a is electrically insulated from the upper electrode 33b. The dummy mesa 30d fails to have a function as a light-receiving element.

The upper electrode 23 of the light-receiving element 20a is coupled to the upper electrode 33a of the dummy mesa 30d by the wiring 40b going through the surface of the light-receiving element 20a, the upper face of the semiconductor substrate 10, and the surface of the dummy mesa 30d. The upper electrode 33b of the dummy mesa 30d is coupled to the lower electrode 24 of the light-receiving element 20b by the wiring 40c going through the surface of the dummy mesa 30d, the upper face of the semiconductor substrate 10 and the surface of the light-receiving element 20b.

As illustrated in FIG. 7A, the carrier wiring 50a is coupled to the upper electrode 33 of the dummy mesa 30a. The carrier wiring 50b is coupled to the upper electrode 33a and the upper electrode 33b of the dummy mesa 30d. The carrier wiring 50c is coupled to the upper electrode 33 of the dummy mesa 30c. Therefore, as illustrated in FIG. 7B, in the module 101a, the light-receiving elements 20a and 20b act as a balanced type light-receiving element in which the light-receiving elements 20a and 20b are coupled in series in an identical direction.

In the second embodiment, the influence of the capacitance caused by the wiring is suppressed, because the width of the wirings 40b and 40c is smaller than that of the wirings 40a and 40d, on the semiconductor substrate 10. And the inductance of the wiring is suppressed. The wiring coupling the upper electrode 23 of the light-receiving element 20a and the lower electrode of the light-receiving element 20b may have a gap. In this case, a carrier wiring or the like is provided in the gap.

Third Embodiment

FIG. 8 illustrates a top view of a semiconductor light-receiving device 100b in accordance with a third embodiment. The shape of the light-receiving elements 20a and 20b and the wirings 40a through 40d of the semiconductor light-receiving device 100b is different from that of the semiconductor light-receiving device 100a. As illustrated in FIG. 8, the lower mesa 21 (the n-type semiconductor layer 25) has a circular cylinder shape, and a part of the circumference is cut off. FIG. 9A illustrates a module 101b in which the semiconductor light-receiving device 100b is coupled to the carrier 50. FIG. 9B illustrates a circuit diagram of the module 101b. As illustrated in FIG. 9B, the module 101b has a balanced type light-receiving element in which the light-receiving elements 20a and 20b are coupled in series in an identical direction.

In the third embodiment, the wiring 40b has a first region and a second region having a different width. In this way, the wiring does not have to have an identical width on the semiconductor substrate 10. However, at least a part of the wirings 40a and 40d on the semiconductor substrate 10 has a width larger than the maximum width of the wirings 40b and 40c on the semiconductor substrate 10. Therefore, the influence of the capacitance caused by the wiring is suppressed, and the inductance of the wiring is suppressed.

In the example of FIG. 8, the wiring 40b has a first width on the upper face and the side face of the light-receiving element 20a that is smaller than a second width on the semiconductor substrate 10. In this case, the capacitance between the wiring 40b and the light-receiving element 20a is suppressed. The wiring 40d may have a first width on the upper face and the side face of the light-receiving element 20b that is smaller than a second width on the semiconductor substrate 10. In this case, the capacitance between the wiring 40d and the light-receiving element 20b is suppressed. As an example, the diameter of the lower mesa 21 of the light-receiving elements 20a and 20b is 100 µm. The diameter of the upper mesa 22 of the light-receiving elements 20a and 20b is 50 µm. On the semiconductor substrate 10, the width of the parallel region of the wirings 40a and 40d is 20 µm, and the width of the parallel region of the wirings 40b and 40c is 10 µm. In the wiring 40b, a width on the upper face and the side face of the light-receiving element 20a and a smaller width on the semiconductor substrate 10 is 5 µm. In the wiring 40d, a width on the upper face and the side face of the light-receiving element 20b and a smaller width on the semiconductor substrate 10 is 5 µm. The length of the parallel region of the wirings 40a through 40d is 120 µm. In the wiring 40b, the total of the length on the upper face and the side face of the light-receiving element 20a and the length of the smaller-width region on the semiconductor substrate 10 is 50 µm. In the wiring 40d, the total length of the length on the upper face and the side face of the light-receiving element 20b and the length of the smaller-width region on the semiconductor substrate 10 is 50 µm. It is preferable that the parallel region of the wirings 40a through 40d is 50 µm to 200 µm.

In the above-mentioned embodiments, on the semiconductor substrate 10, both of the wirings 40a and 40d have a width larger than that of the wirings 40b and 40c. However, only one of the wirings 40a and 40d may have a width larger than that of the wirings 40b and 40c. In this case, the influence of the capacitance caused by the wiring is suppressed, and the inductance of the wiring is suppressed. In the above-mentioned embodiments, the present invention is applied to a light-receiving element of a back surface incident type. However, the present invention can be applied to a semiconductor light-receiving element of a front surface incident type.

Both capacitances of the wirings 40b and 40c are not always smaller than those of the wirings 40a and 40d. This is because the length of the wiring has an influence on the capacitance. The length of the wiring may be changed according to a layout of a semiconductor light-receiving element or a pad. However, in the embodiments, the capacitance can be reduced when the width of the wirings 40b and 40c is smaller than that of the wirings 40a and 40d. Even such cases, the embodiments contribute to the improvement of characteristics.

The embodiments can be applied to a light-receiving element other than the balanced type. Even if only one semiconductor element is provided, a width of a wiring to be coupled to an output side can be smaller than that of a wiring to be coupled to a reference potential side. Thus, the parasitic capacitance on the side of output is reduced. The parasitic inductance on the side of the reference potential is reduced. And, the characteristics of the semiconductor light-receiving device are improved.

The semiconductor light-receiving device has the p-side electrode and the n-side electrode. It makes no difference if the p-side electrode is coupled to the output side or the n-side electrode is coupled to the output side. It makes no difference if the p-side electrode is coupled to the reference potential side or the n-side electrode is coupled to the reference potential.

The present invention is not limited to the specifically disclosed embodiments and variations but may include other embodiments and variations without departing from the scope of the present invention.

What is claimed is:

1. A semiconductor light-receiving device comprising:
   a semiconductor light-receiving element that has a first electrode and a second electrode;
   a first wiring coupled to the first electrode; and
   a second wiring coupled to the second electrode,
   a width of the second wiring being smaller than a width of the first wiring.

2. The semiconductor light-receiving device as claimed in claim 1, wherein:
   the second electrode is an electrode to be coupled to an output side; and
   the first electrode is an electrode to be coupled to a reference potential side.

3. The semiconductor light-receiving device as claimed in claim 1, wherein the semiconductor light-receiving element has a mesa structure on a semiconductor substrate.

4. The semiconductor light-receiving device as claimed in claim 3, wherein one of the first wiring and the second wiring extends from the mesa structure to outside of the mesa structure of the semiconductor substrate.

5. The semiconductor light-receiving device as claimed in claim 4, wherein one of the first wiring and the second wiring has a region extended to the semiconductor substrate via an upper portion and a side face of the mesa structure, and has a first width on the side face of the mesa structure that is smaller than a second width on the semiconductor substrate.

6. The semiconductor light-receiving device as claimed in claim 1, wherein a width of a longest region of a parallel region of the second wiring in a length direction is smaller than a width of a longest region of a parallel region of the first wiring in a length direction.

7. The semiconductor light-receiving device as claimed in claim 6, wherein:
   the semiconductor light-receiving element has a mesa structure on a semiconductor substrate; and
   lengths of the longest regions of the first wiring and the second wiring are larger than a diameter of an upper face of the mesa structure.

8. A semiconductor light-receiving device comprising:
   a semiconductor light-receiving element that has a first electrode and a second electrode;
   a first wiring coupled to the first wiring; and
   a second wiring coupled to the second electrode,
   a parasitic capacitance of the first wiring being smaller than a parasitic capacitance of the second wiring.

9. The semiconductor light-receiving device as claimed in claim 8, wherein a parasitic inductance of the second wiring is smaller than a parasitic inductance of the first wiring.

10. The semiconductor light-receiving device as claimed in claim 8, wherein:
    the first electrode is an electrode to be coupled to an output side; and
    the second electrode is an electrode to be coupled to a reference potential side.

11. A semiconductor light-receiving device comprising:
    a first semiconductor light-receiving element that has a first electrode and a second electrode;
    a second semiconductor light-receiving element that has a third electrode and a fourth electrode;
    a first wiring of which first end is coupled to the first electrode;
    a second wiring of which first end is coupled to the second electrode;
    a third wiring of which first end is coupled to the third electrode; and
    a fourth wiring of which first end is coupled to the fourth electrode,
    widths of the second wiring and the third wiring being smaller than widths of the first wiring and the fourth wiring.

12. The semiconductor light-receiving device as claimed in claim 11, wherein:
    the second wiring and the third wiring are an electrode to be coupled to an output side; and
    the first electrode and the fourth electrode are an electrode to be coupled to a reference potential side.

13. The semiconductor light-receiving device as claimed in claim 11, wherein a second end of the second wiring and a second end of the third wiring are coupled to a different terminal and are coupled to each other on a mount substrate on which the semiconductor light-receiving device is mounted.

14. The semiconductor light-receiving device as claimed in claim 11, wherein the second end of the second wiring and the second end of the third wiring are coupled in common.

15. The semiconductor light-receiving device as claimed in claim 11, wherein the first semiconductor light-receiving element and the second semiconductor light-receiving element have a mesa structure on a semiconductor substrate independently from each other.

16. The semiconductor light-receiving device as claimed in claim 15, wherein the first wiring and the fourth wiring extend from the mesa structure to outside of the mesa structure of the semiconductor substrate.

17. The semiconductor light-receiving device as claimed in claim 15, wherein:
    the first wiring and the fourth wiring have a region extended to the semiconductor substrate via an upper portion and a side face of the mesa structures; and
    widths of the first wiring and the fourth wiring on the side face of the mesa structures are smaller than other widths of the first wiring and the fourth wiring on the semiconductor substrate.

18. The semiconductor light-receiving device as claimed in claim 11, wherein a width of longest regions of parallel regions of the second wiring and the third wiring in a length direction is smaller than widths of longest regions of parallel regions of the first wiring and the fourth wiring in a length direction.

19. The semiconductor light-receiving device as claimed in claim 18, wherein:
    the first semiconductor light-receiving element and the second semiconductor light-receiving element have a mesa structure on a semiconductor substrate; and
    lengths of the longest regions of the first wiring, the second wiring, the third wiring and the fourth wiring are larger than a diameter of an upper face of the mesa structure.

* * * * *